United States Patent [19]

Decker et al.

[11] 4,157,556

[45] Jun. 5, 1979

[54] HETEROJUNCTION CONFINEMENT FIELD EFFECT TRANSISTOR

[75] Inventors: David R. Decker, Charlottesville, Va.; Ronald L. Moon, Menlo Park, Calif.

[73] Assignee: Varian Associates, Inc., Palo Alto, Calif.

[21] Appl. No.: 757,258

[22] Filed: Jan. 6, 1977

[51] Int. Cl.² ............................................. H01L 29/80
[52] U.S. Cl. ......................................... 357/22; 357/23; 357/16; 357/61; 357/63
[58] Field of Search ...................... 357/22, 16, 61, 63

[56] References Cited

U.S. PATENT DOCUMENTS

| 3,657,615 | 4/1972 | Driver | 357/22 |
| 3,767,984 | 10/1973 | Shinoda et al. | 357/16 |
| 3,997,908 | 12/1976 | Schloetterer et al. | 357/22 |

*Primary Examiner*—Edward J. Wojciechowicz
*Attorney, Agent, or Firm*—Stanley Z. Cole; Richard B. Nelson; Robert K. Stoddard

[57] ABSTRACT

An improved field-effect transistor is provided by forming the conducting channel boundary opposite the gate electrode as a heterojunction. For example a GaAs conducting channel may be bounded by an AlGaAs layer. The conduction electrons can penetrate the boundary very little and are constrained to the channel layer having good transport properties. The output conductance is reduced and the transconductance increased.

9 Claims, 5 Drawing Figures

HETEROJUNCTION CONFINEMENT FIELD EFFECT TRANSISTOR

The invention herein described was made in the course of or under a contract or subcontract thereunder (or grant) with the Department of the Navy, Office of Naval Research.

1. Field of the Invention

The invention pertains to field-effect transistors (FET's) in which a conducting layer channel is bounded between an electron-constraining junction and a gate electrode.

2. Prior Art

In prior-art FET's the n-type conducting channel layer was typically bounded on its inner surface, facing the substrate, by having the substrate doped with chromium to form a region of high resistivity (typically $10^6$ to $10^8$ ohm-cm). The boundary between regions was not completely sharp so some conduction electrons penetrated the substrate, causing a reduction of the transconductance as well as some conductivity from source to drain controlled by the voltage between them—that is, an increased internal conductance of the output circuit.

SUMMARY OF THE INVENTION

An objective of the invention is to provide an FET with decreased output conductance.

A further objective is to provide an FET with increased transconductance.

A further objective is to provide an FET permitting higher operating frequency.

A further objective is to provide an FET with reduced noise output.

These objectives are realized in making the confining barrier between the conducting channel and the substrate as a heterojunction between a good semi-conducting material and a relatively insulating material. Epitaxial growth techniques may be used to form the structure.

DESCRIPTION OF THE PREFERRED EMBODIMENTS

Figure 1:
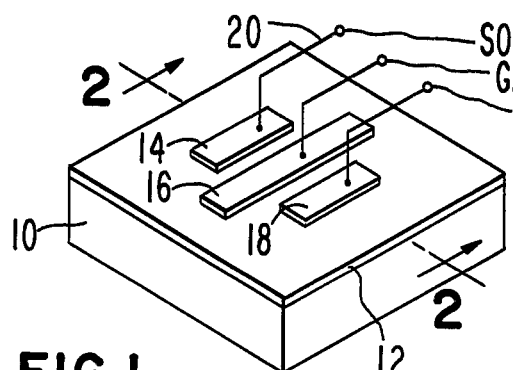
FIG. 1 is a perspective view of a FET in which the invention may be embodied.

FIG. 1 shows schematically a FET according to the prior art. The identical construction may, however, be used with the present invention, only the materials being different. A single-crystal substrate 10 of low-conductivity material such as gallium arsenide heavily doped with chromium forms the support for the transistor and, as will be explained below, also participates in its electrical performance. On the upper surface of substrate 10 a thin layer 12 of active, semiconductive material such as n-type GaAs doped with Sn, Te or S is formed, as by liquid or vapor epitaxial growth. Active layer 12 conducts the controlled current through the transistor. On the upper surface of layer 12 are formed, as by conventional photolithographic techniques, the three metallic electrodes of the transistor; a source 14 and drain 18 separated by an elongated gate electrode 16. The electrodes 14, 16, 18 are connected to conducting leads 20, 22, 24 respectively for connection to external circuit elements.

Figure 2:
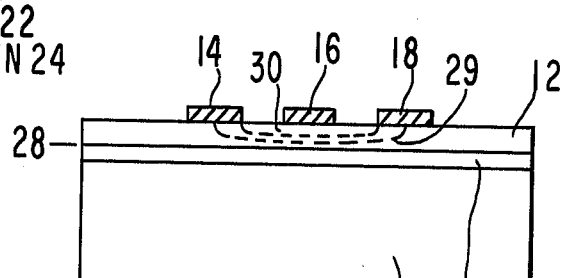
FIG. 2 is a sectional end view of a FET according to the present invention.

FIG. 2 shows an enlarged sectional view of a transistor embodying the present invention. The physical arrangement of elements is identical to those shown in FIG. 1 except that in the embodiment of FIG. 2 an additional, boundary region 26 is interposed between substrate 10 and active layer 12. Boundary region 26 need not be of a composition different from substrate 10. In other embodiments of the invention the upper portion of substrate 10 may itself form the boundary. In the embodiment of FIG. 2, however, boundary region 26 may be of undoped or of p-type AlGaAs or InGaAsP. The important feature is that the junction 28 between active layer 12 and boundary region 26 is a heterojunction. Both boundary region 26 and active layer 12 may be epitaxially grown on substrate 10. Lines of current flow 29 are shown between source 14 and drain 18. Current 29 is constrained to flow between the relatively insulating boundary region 26 and a carrier depletion region 30 in the neighborhood of gate 16.

Figure 3:
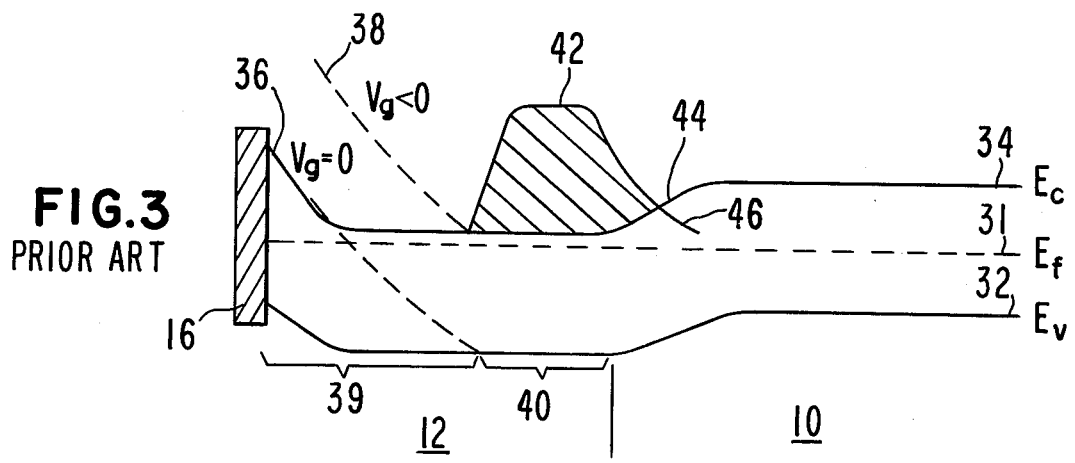
FIG. 3 is a schematic graph of the spatial variation of the energy levels in a prior-art FET.

FIG. 3 shows an energy level diagram of the region between gate 16 and substrate 10 of a prior art FET. The abscissa represents depth into the structure from the top surface and the ordinate represents electron energy. The Fermi potential 31 forms the base from which the potentials are measured. The bound electron potential 32 does not affect the conduction of the FET. The potential 34 of the bottom of the conduction band is the important variable. Potential 34 has a sharp rise 36 as it approaches the Schottky barrier associated with gate 16 in the prior art FET illustrated by FIG. 3. Substrate 10 is doped with Cr to make it relatively insulating. As the potential of gate 16 is raised (made more negative) the potential in the neighboring part of the channel is raised as shown by curve 38. The depletion region 39 enlarges, pinching down against substrate 10 the area 40 of channel 12 available for electron flow. The spatial distribution of the cross section of electron current density is indicated by superposed graph 42.

In the prior art FET of FIG. 3 it is not possible to obtain a completely sharp transition between the Cr doped, low-conductivity substrate 10 and the high-conductivity active layer 12. The conduction-band potential 34 thus tails off slowly into the surface of the active layer 12, so that a tailing-off distribution of electrons 46 flows near the edge of the substrate. This unconfined current reduces the internal output impedance of the FET. That is, this current is controlled more by the drain-to-source voltage than is the current 42 in the active layer proper 12. By the same token, current 46 leaking through substrate 10 is less controlled by the potential of gate 16, resulting in a loss of transconductance.

Figure 4:
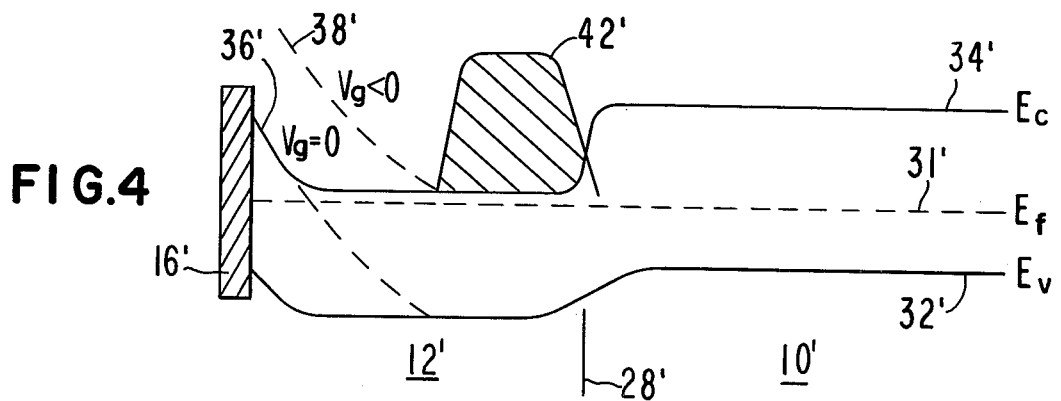
FIG. 4 is a graph similar to FIG. 3 illustrating the energy levels in the present invention.

FIG. 4 is a graph showing the improvement produced by the present invention. Here substrate 10' is of a different material from active conducting layer 12'. For example, substrate 10' may be Cr doped AlGaAs while active layer 12' may be n-type GaAs. Heterojunction 28' can be made a very sharp boundary, as by growing active layer 12' on substrate 10' by liquid epitaxy. The electron current, sharply confined to active channel 12' has a high effective velocity, so that the high-frequency performance of the FET is improved. Also, as described above, the adverse effects on transconductance and output impedance are reduced.

Figure 5:
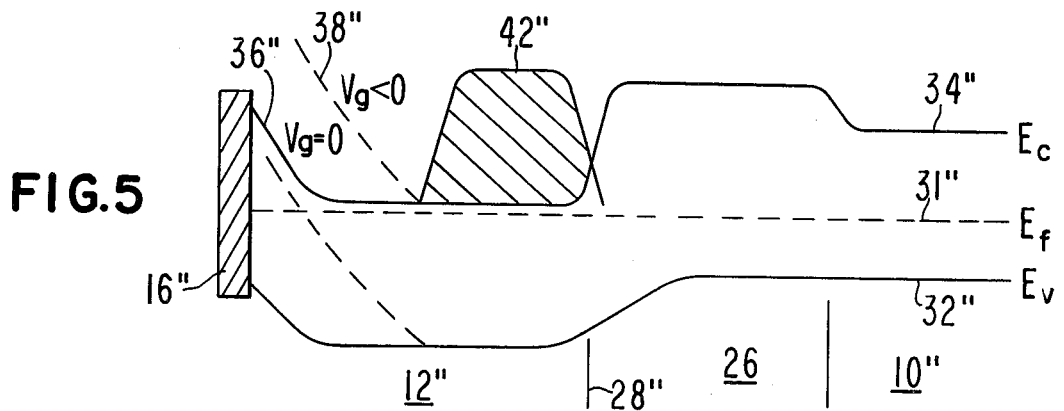
FIG. 5 illustrates energy levels in a different embodiment.

FIG. 5 shows the energy levels in the different embodiment illustrated by FIG. 2. Here substrate 10" does not abut heterojunction 28". Thus the restrictions on the conductivity of bulk substrate 10" may be relaxed. An intermediate boundary region 26 forms the actual heterojunction 28". Layer 26, which may be epitaxially grown on substrate 10" may be undoped or Cr doped AlGaAs or InGaAsP, for example. Having the Cr-doped substrate well removed from the conduction channel should further improve the electron transport.

Another advantage of the heterojunction confinement FET is that trap noise should be reduced.

The above described embodiments of the invention are of course illustrative only. Many other semiconductive materials and even different classes of materials may be used without departing from the scope of the invention. The invention is intended to be limited only by the following claims and their legal equivalents.

We claim:

1. A field-effect transistor comprising:
   an active layer of semiconductive material, source, gate and drain electrodes on a first side of said active layer, and
   a semiconductor boundary layer adjoining the second side of said active layer, said boundary layer having a chemical composition different from said active layer and an electrical conductivity substantially lower than said active layer, said semiconductor layer and said active layer forming a heterojunction along said second side, whereby electrons are confined to flow only in said active layer by said heterojunction.

2. The transistor of claim 1 wherein said active layer is epitaxial with said boundary layer.

3. The transistor of claim 1 further including a substrate body adjoining said boundary layer on the side opposite said active layer, said substrate body having lower electrical conductivity than said active layer and chemical composition different from said boundary layer.

4. The transistor of claim 3 wherein said active layer and said boundary layer are epitaxial with said substrate.

5. The transistor of claim 1 wherein said active layer is n-type gallium arsenide.

6. The transistor of claim 5 wherein said boundary layer is aluminum gallium arsenide.

7. The transistor of claim 5 wherein said boundary layer is indium gallium arsenide phosphide.

8. The transistor of claim 3 wherein said substrate body is p-type gallium arsenide.

9. The transistor of claim 8 wherein said p-type GaAs is doped with Ge, Zn, Cd or Mg.

* * * * *